United States Patent
Song et al.

(10) Patent No.: US 9,954,125 B2
(45) Date of Patent: Apr. 24, 2018

(54) LIGHT SPOT POSITION DETECTOR WITH AN ARRAY OF NANORODS

(71) Applicant: Forwarding Technology LTD, Road Town (GB)

(72) Inventors: Jinhui Song, Marietta, GA (US); Chengming Jiang, Tuscaloosa, AL (US)

(73) Assignee: Forwarding Technology LTD, Road Town (GB)

( * ) Notice: Subject to any disclaimer, the term of this patent is extended or adjusted under 35 U.S.C. 154(b) by 297 days.

(21) Appl. No.: 14/527,997

(22) Filed: Oct. 30, 2014

(65) Prior Publication Data

US 2015/0129743 A1    May 14, 2015

Related U.S. Application Data

(60) Provisional application No. 61/903,057, filed on Nov. 12, 2013.

(51) Int. Cl.
*H01L 31/0296* (2006.01)
*H01L 27/146* (2006.01)
(Continued)

(52) U.S. Cl.
CPC ...... *H01L 31/0296* (2013.01); *H01L 27/1446* (2013.01); *H01L 27/14601* (2013.01);
(Continued)

(58) Field of Classification Search
CPC ................ B82Y 20/00; H01L 31/0296; H01L 31/035227; H01L 31/09; H01L 27/14601;
(Continued)

(56) References Cited

U.S. PATENT DOCUMENTS

| | | | | |
|---|---|---|---|---|
| 3,246,161 A | * | 4/1966 | Thompson | ............... G01D 5/26 250/214 PR |
| 5,341,155 A | * | 8/1994 | Elrod | .................... G06F 3/0425 345/156 |

(Continued)

*Primary Examiner* — Que T Le
*Assistant Examiner* — Jennifer Bennett
(74) *Attorney, Agent, or Firm* — Meunier Carlin & Curfman LLC

(57) ABSTRACT

Various examples are provided for pillar array photo detectors. In one example, among others, a photo detection system includes an array of substantially aligned photo sensitive nanorods extending between first and second electrodes, and a plurality of resistance monitoring circuits coupled at different positions about the circumference of the electrodes. In another example, a photo detector includes first and second electrodes, and an array of substantially aligned photo sensitive nanorods extending between the substantially parallel electrodes. Light passing through an electrode excites electrons in the photo sensitive nanorods that are illuminated by the light. In another example, a method includes illuminating a portion of a photo detector including an array of substantially aligned photo sensitive nanorods with a light spot, obtaining resistance measurements at a plurality of locations around the array, and determining a position of the light spot on the photo detector based upon the resistance measurements.

23 Claims, 10 Drawing Sheets

(51) Int. Cl.
*H01L 31/0352* (2006.01)
*H01L 31/09* (2006.01)
*H01L 27/144* (2006.01)
*B82Y 20/00* (2011.01)

(52) U.S. Cl.
CPC ............... *H01L 27/14607* (2013.01); *H01L 31/035227* (2013.01); *H01L 31/09* (2013.01); *B82Y 20/00* (2013.01); *Y10S 977/762* (2013.01)

(58) Field of Classification Search
CPC ........... H01L 27/14607; H01L 27/1446; Y10S 977/762
USPC ................... 250/214.1, 214 R, 208.1; 257/9; 977/811, 762
See application file for complete search history.

(56) References Cited

U.S. PATENT DOCUMENTS

| | | | | |
|---|---|---|---|---|
| 6,568,285 B1* | 5/2003 | Moore | ................ | G01L 5/0085 73/159 |
| 6,882,051 B2* | 4/2005 | Majumdar | ............ | B82Y 10/00 257/734 |
| 2005/0214452 A1* | 9/2005 | Forrest | ................ | G02B 6/262 427/162 |
| 2009/0109828 A1* | 4/2009 | Wang | ................ | G11B 7/122 369/112.23 |
| 2010/0295019 A1* | 11/2010 | Wang | ................ | B82Y 20/00 257/21 |
| 2010/0320444 A1* | 12/2010 | Dutta | ................ | H01L 25/042 257/21 |
| 2015/0209586 A1* | 7/2015 | Silva | ................ | A61L 27/18 607/54 |

\* cited by examiner

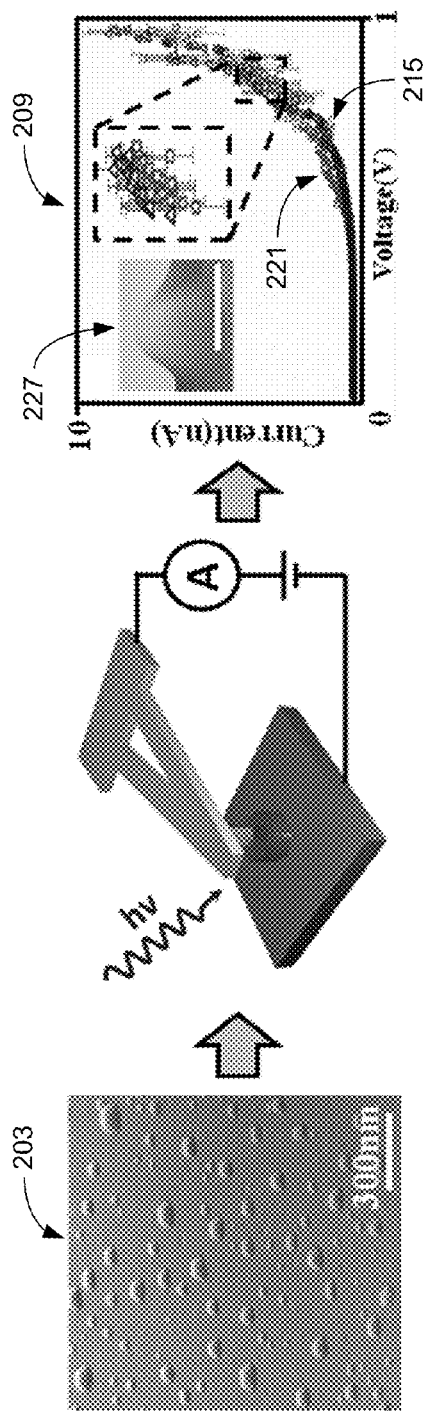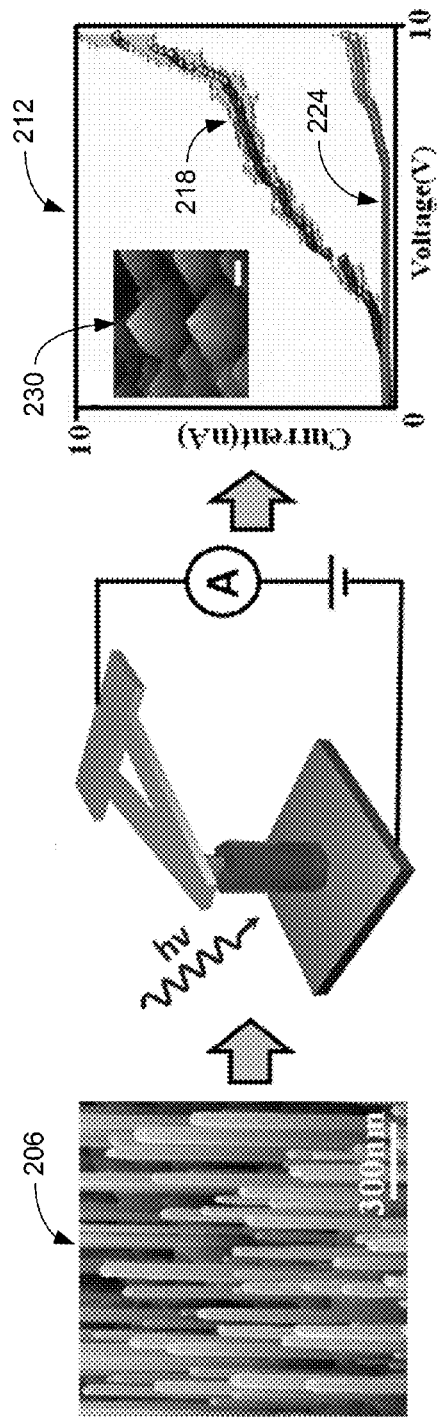

LIGHT SPOT POSITION DETECTOR WITH AN ARRAY OF NANORODS

CROSS-REFERENCE TO RELATED APPLICATIONS

This application claims the benefit of, and priority to, U.S. Provisional Application No. 61/903,057, entitled "Pillar Array Photo Detector" and filed on Nov. 12, 2013, the entire contents of which are hereby incorporated herein by reference.

BACKGROUND

A light spot position detector (LSPD) can be used for system control in various industrial, military and other daily applications. The performance of a precise control system can heavily depend on how precisely the control system can detect a feedback light spot. Presently adopted technology for sensing the spotlight position is based thin film photo detectors. Two-dimensional (2D) photo sensitive devices based on thin film techniques, such as complementary optical metal-oxide-semiconductor (CMOS) or charge-coupled device (CCD), can achieve light detection with micrometer resolutions.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 2A and 2B illustrate testing of zinc oxide (ZnO) nanorods used in the 3D PAD of FIG. 1B in accordance with various embodiments of the present disclosure.

DETAILED DESCRIPTION

Figure 1A:
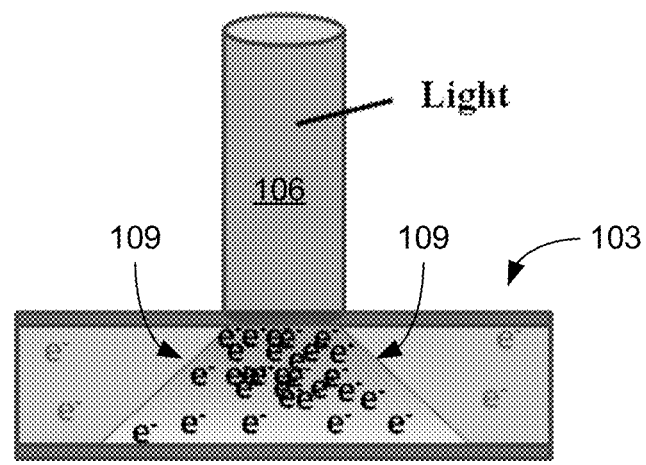
FIG. 1A is a graphical representation of an example of a two-dimensional (2D) thin film photo sensitive device (PSD) in accordance with various embodiments of the present disclosure.

Disclosed herein are various examples related to pillar array photo detectors. Reference will now be made in detail to the description of the embodiments as illustrated in the drawings, wherein like reference numbers indicate like parts throughout the several views.

Referring to FIG. 1A, shown is a graphical representation of an example of a two-dimensional (2D) thin film photo sensitive device (PSD) 103. When a portion of the 2D thin film photo sensitive device 103 is illuminated by light 106, the illumination changes the concentration of the electrons that will spread through the film. Without lateral confinement, the light excited electrons in the 2D thin film PSD 103 form a diffusion gradient 109. As illustrated in FIG. 1A, the diffusion gradient 109 leads to an uneven diffusion of the electrons within the film of the 2D thin film PSD 103, which adversely affects the light position detection resolution. The most common method to increase resolution is to decrease the pixel size, which is, however, limited by the manufacturing process. More importantly, noise is a negative factor for higher resolutions since the 2D thin film PSD 103 is more vulnerable to noise with the smaller pixel size. Presently, CMOS and CCD can achieve micrometer resolution, which approaches their physical size limitation based on the thin film technique.

Figure 1B:
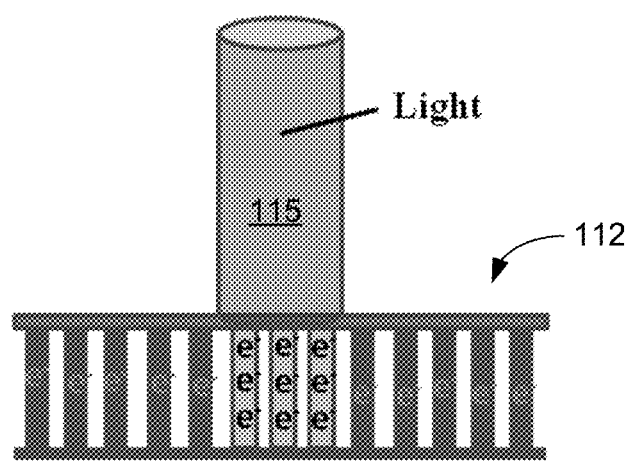
FIG. 1B is a graphical representation of an example of a three-dimensional (3D) pillar array device (PAD) in accordance with various embodiments of the present disclosure.

Nanoscale photo sensitive structures can be produced using three-dimensional (3D) pillar arrays of nanorods. A 3D pillar array device (PAD) includes a plurality of vertically aligned nanorods (or nanowires) as pixels. FIG. 1B, shows a graphical representation of an example of a 3D PAD 112 including photo sensitive nanorods. For example, vertically aligned zinc oxide (ZnO) nanorods (or nanowires), with diameters of tens of nanometers, can preserve the detectable photoelectric response when the heights are above a predefined value. In other embodiments, the nanorods may comprise other photosensitive semiconducting materials such as, e.g., GaN, Si, $Al_2S_3$, InSb, Ge, Se, PbS, $Bi_2S_3$, etc. When a portion of the 3D PAD 112 is illuminated by light 115, the light excited electrons are confined within the boundaries of the corresponding nanorods (or nanowires) without lateral dispersion as illustrated in FIG. 1B. This feature of the 3D PAD 112 overcomes the electron dispersion in the continuous thin film of FIG. 1A. A large oxidization enhanced surface volume ratio (high oxygen absorption) enables the ZnO nanorods (or nanowires) to exhibit a strong photoelectric effect, resulting in nanoscale resolution.

Different from the thin-film technique, which only concerns 2D size, the detectable photoelectric characteristic of ZnO nanorods is not controlled by its 2D radial size. Instead, the detectable photoelectric characteristic is determined by the nanorod's 3D volume. The photoelectric effect resistance changes with respect to the volume of ZnO. In this way, the size limitation of 2D photo sensitive pixels may be overcome by using a 3D pixel. Based on this, a LSPD using grown ZnO nanorod arrays was implemented with a measured resolution of 200 nm. In other embodiments, the resolution may be improved to 10 nm or even smaller resolutions. The pixel size of the LSPD (the diameter of aligned nanorods) may be reduced to the tens of nanometer range, while the height of the pixel compensates the volume that is needed to be over the detectable photoelectric limitation. The spacing between the nanorods of the array may be about 500 nm or less, about 200 nm or less, about 100 nm or less, about 50 nm or less, about 20 nm or less, or about 10 nm or less, comparable with the diameter of the nanorod to provide the appropriate resolution.

In nanoscale, the basic properties of materials deviate from those of their bulk counterparts. The effect of size on the detactable photoelectric effect of ZnO nanorods (or nanowires) was examined through experimentation. It was found that the photoelectric effect of a ZnO nanorod becomes undetectable when its volume is small enough. Referring to FIGS. 2A and 2B, shown are examples of testing of ZnO nanorods with different volumes. The scanning electron microscope (SEM) image 203 of FIG. 2A illustrates short ZnO nanorods that were grown with a radius of 25 nm and a height of 40 nm on a conductive substrate and the SEM image 206 of FIG. 2B illustrates tall ZnO nanorods that were grown with the same radius of 25 nm and a height of 2 µm on a conductive substrate.

Using Current Atomic Force Microscopy (I-AFM, Park XE-70), the conductivity of the short and tall ZnO nanorods were directly measured under illumination and in a dark environment as graphically illustrated in FIGS. 2A and 2B. The resulting current-voltage (IV) curves are shown in plots 209 and 212 for the short and tall ZnO nanorods, respectively. The curves 215 and 218 are the IV curve under illumination and the curves 221 and 224 are from the dark environment. In plot 209, the currents of the short ZnO nanorod under illumination (curve 215) and in the dark (curve 221) overlap making identification difficult. In contrast, the currents of the tall ZnO nanorod under illumination (curve 218) and in the dark environment (curve 224) are clearly different. Performing these measurements on ZnO nanorods with the same radius and different heights, it was found that the photoelectric effect becomes detectable as the height increases. The insets 227 and 230 of plots 209 and 212 depict the topographies of the short and tall ZnO nanorod to illustrate physical sizes. The insets 227 and 230 were obtained by AFM working in tapping mode and the scale bars illustrate a distance of 25 nm.

To explain the measured phenomenon, an analytical model was developed to describe the average electron density of ZnO nanorods in a dark environment at 300K. The dark electron density ($n_{dark}$) may be expressed as:

$$n_{dark} = \left(1 - \frac{r_b}{R_{rod}}\right)\left(n_{thermal} + \frac{2\lambda_{mfp}n_{pe}}{h_{rod}}\right), \quad \text{EQN. 1}$$

where, $n_{thermal}$ is the thermal electron density in the conduction band; $n_{pe}$ is the light excited electron density in the conduction band; $h_{rod}$ is the height of the ZnO nanorod; $R_{rod}$ is the radius of the ZnO nanorod; $r_b$ is the Bohr radius of ZnO; and $\lambda_{mfp}$ is the mean free path of electrons in ZnO.

Figure 2C:
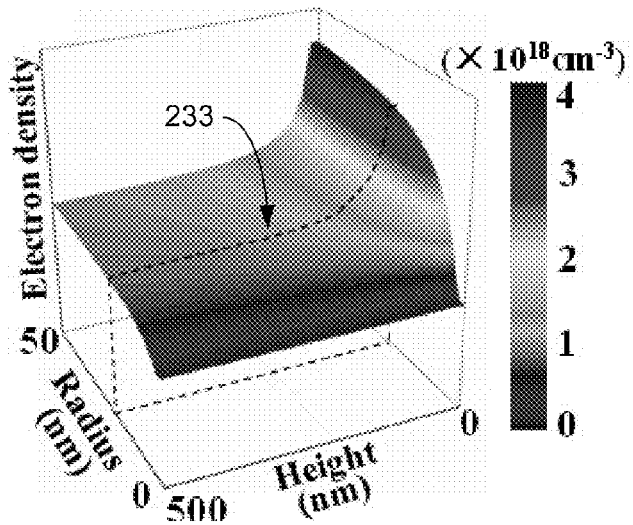
FIGS. 2C through 2E are plots illustrating characteristics of the ZnO nanorods of FIG. 2B in accordance with various embodiments of the present disclosure.
Figure 2D:
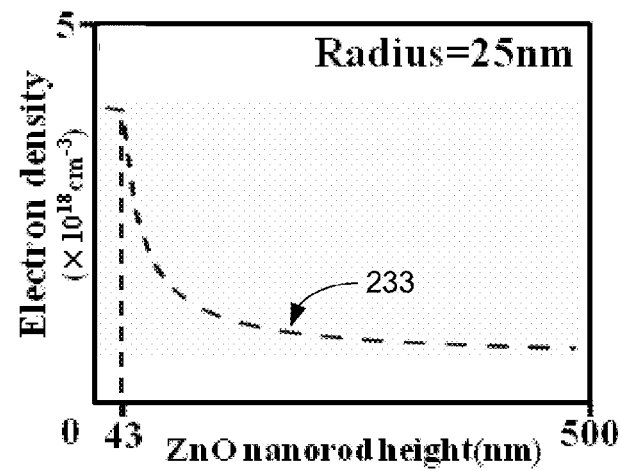

FIG. 2C shows an example of a contour plot of electron density of a ZnO nanorod in a dark environment at 300K as a function of the radius and the height of the ZnO nanorod. When the radius or height is small enough, the dark electron density will arrive at a constant value, i.e., the thermal electron supersaturates. The curve 233 in FIG. 2D, as well as the dotted line 233 in FIG. 2C, shows that the electron density changes with the height of ZnO nanorod with a fixed radius of 25 nm. It was found that when the height of the 25 nm ZnO nanorod decreases to 43 nm or below, the electron density becomes a nearly constant supersaturated value. The movement of electron transition between the valance and the conduction bands of ZnO is a dynamic equilibrium process. Under applied electrical potential, once electrons in the valance band are excited into the conduction band, they will move along the electrical field. Because the height of a short ZnO nanorod is small enough compared with the mean free path of electrons, the excited electrons do not have the opportunity to collide and fall into the valance band to recombine with holes. In other words, all electrons that can be excited have been excited into the conduction band and the valance band has no more electrons for further light excitation. Therefore, the illumination and dark conditions are almost the same in terms of electron density for short ZnO nanorods.

The ratio of ZnO nanorod resistance under illumination and in a dark environment at 300K may be described as follows:

$$\frac{r_{light}}{r_{dark}} = \frac{n_{thermal} + n_{pe}}{\left(1 - \frac{r_b}{R_{rod}}\right)\left(n_{thermal} + \frac{2\lambda_{mfp}n_{pe}}{h_{rod}}\right)}. \quad \text{EQN. 2}$$

Figure 2E:
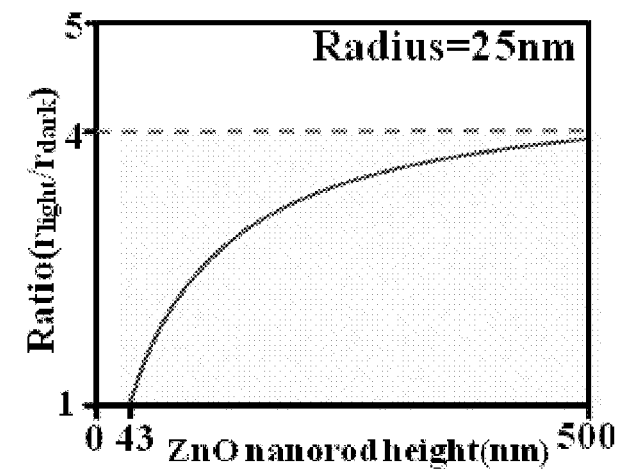

FIG. 2E illustrates a plot of the ratio for ZnO nanorods with a radius of 25 nm. From EQN. 2, the ZnO nanorod with a 25 nm radius can produce a stable and detectable resistance ratio when the length is longer than 500 nm. The photoelectric effect in ZnO nanorods will be undetectable when their physical sizes get too small. To overcome this limitation and significantly reduce the photoelectric pixel size, the height (or length) of the ZnO nanorods may be increased as compensation while keeping the radius small.

Figure 3A:
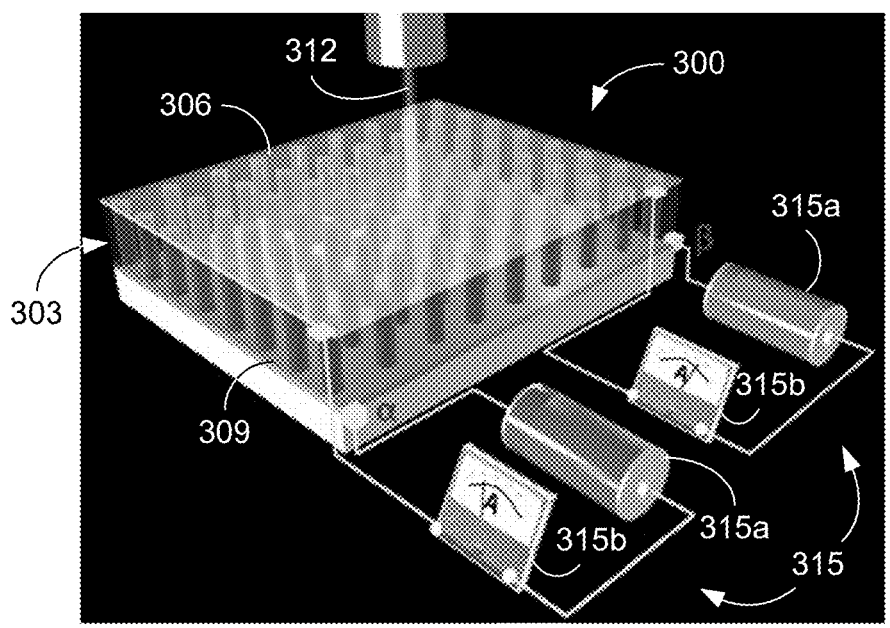
FIG. 3A is a graphical representation of an example of a light spot position detector (LSPD) based upon the 3D PAD of FIG. 1B in accordance with various embodiments of the present disclosure.

A light spot position detector (LSPD) based upon the 3D PAD results will now be presented. The LSPD uses vertically aligned ZnO nanorods as 3D pixels, which results in both the ultra-high nanoscale resolution and outstanding photo detection performance. Referring to FIG. 3A, shown is a schematic illustration of an example of the structure and operation of a sandwich-structured 3D PAD 112 (FIG. 1) in the LSPD 300. In the example of FIG. 3A, one or more high density arrays of aligned nanorods 303 are perpendicularly grown between top and bottom electrodes, 306 and 309 respectively. For example, millions of vertically aligned nanorods (or nanowires) 303 can form nanoscale channels to confine the excited electrons within the volume of the corresponding nanorods 303, thereby preventing lateral dispersion of the excited electrons. The top and bottom electrodes 306 and 309 can be parallel plates and/or conductive substrates. The top electrode 306 and/or the bottom electrode 309 allows at least a portion of a light spot 312 to pass through and illuminate a corresponding portion of the ZnO nanorods 303. A plurality of resistance monitoring circuits 315 including a voltage supply 315a and a current monitoring device 315b are connected between the top electrode 306 and bottom electrode 309 at different locations around a sensing area of the LSPD 300 (e.g., connection points α and β).

Figure 3B:
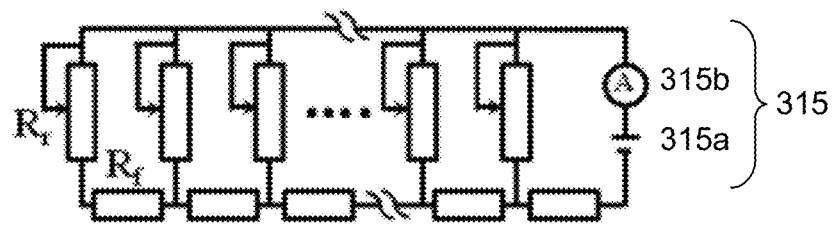
FIG. 3B is an electrical model of a resistance measurement circuit connected to the LSPD of FIG. 3A in accordance with various embodiments of the present disclosure.

When the light spot 312 illuminates a portion of a sensing area of the LSPD 300, the resistance seen by each independent resistance monitoring circuit 315 will be different due to the photoelectric effect of the ZnO nanorod(s) 303 under light excitation. By changing the location of the light spot 312, the resistances of both resistance monitoring circuits 315 will change accordingly. FIG. 3B shows an example of an equivalent circuit for a resistance monitoring circuit 315 connected to the LSPD 300. It is a serial and parallel hybrid resistance combination modeling the variable resistance of the ZnO nanorods 303 ($R_r$) and electrodes 306 and 309 ($R_f$). By measuring the current, and thus the resistance, with both resistance monitoring circuits 315, the position of the light spot 312 can be determined.

Figure 3C:
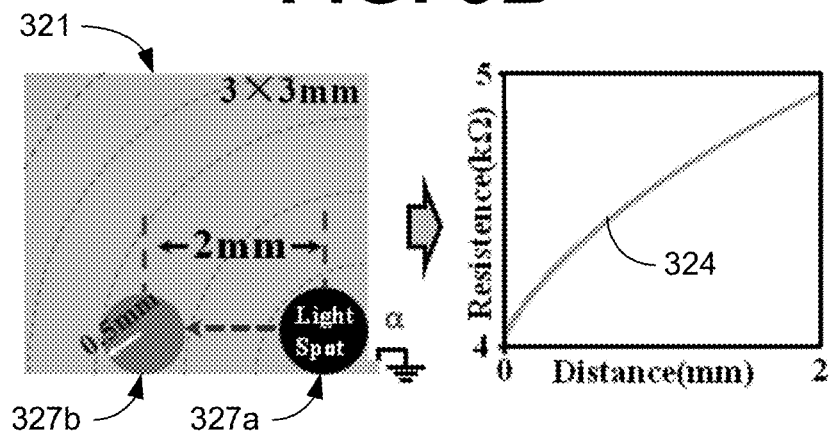
FIGS. 3C and 3D are plots illustrating characteristics of the LSPD of FIG. 3A in accordance with various embodiments of the present disclosure.

FIG. 3C schematically illustrates how the position can be identified using the resistance monitoring circuits 315. FIG. 3C includes a top view 321 of a LSPD 300 with a sensing area having a size of, e.g., 3×3 mm. The dashed lines are equal-current contour lines (about connection point α) seen by the resistance monitoring circuit 315 connected at α. As the position of a light spot 312 moves across the LSPD 300, the resistance varies in a predictable way. For example, the resistance verses light spot distance curve 324 illustrates an example of the variation in resistance seen by the resistance monitoring circuit 315 as a 0.5 mm light spot 312 moves over a 2 mm distance on the top surface of the LSPD 300 from position 327a to 327b. The other resistance monitoring circuit 315 connected at β sees similar equal-current contour lines about the connection point β. The intersecting point of two equal-current contour lines seen by the two resistance monitoring circuits 315 exactly locates the light spot position.

Figure 3D:
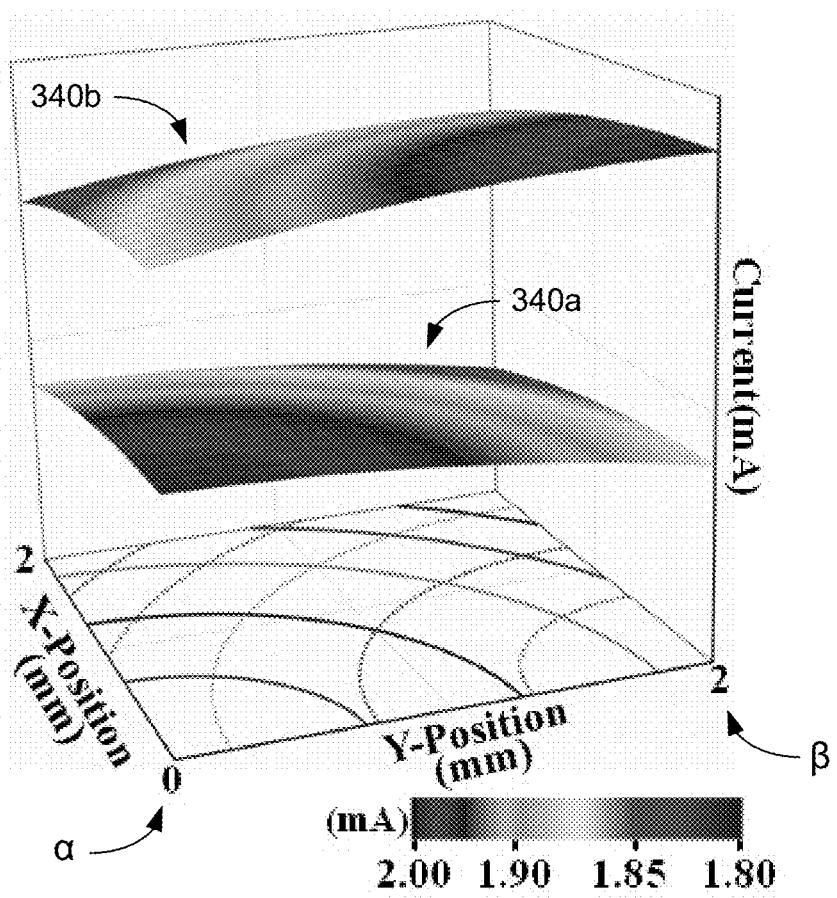

FIG. 3D illustrates contour surface plots of currents with a light spot 312 moving over the surface of a LSPD 300, having a sensing area of 2×2 mm, with resistance measuring circuits 315 connected at α and β. The lower contour surface 340a corresponds to the current seen by the resistance monitoring circuit 315 connected at α and the upper contour surface 340b corresponds to the current seen by the resistance monitoring circuit 315 connected at β. The solid and dashed lines in the x-y plane of FIG. 3D are equal-current contour lines corresponding to the contour surfaces 340a and 340b, respectively, and illustrate intersecting points of the equal-current contour lines. In this way, resistance measurements obtained by the resistance measuring circuits 315 can be used to determine the position of the light spot 312 in x and y coordinates.

Figure 4A:
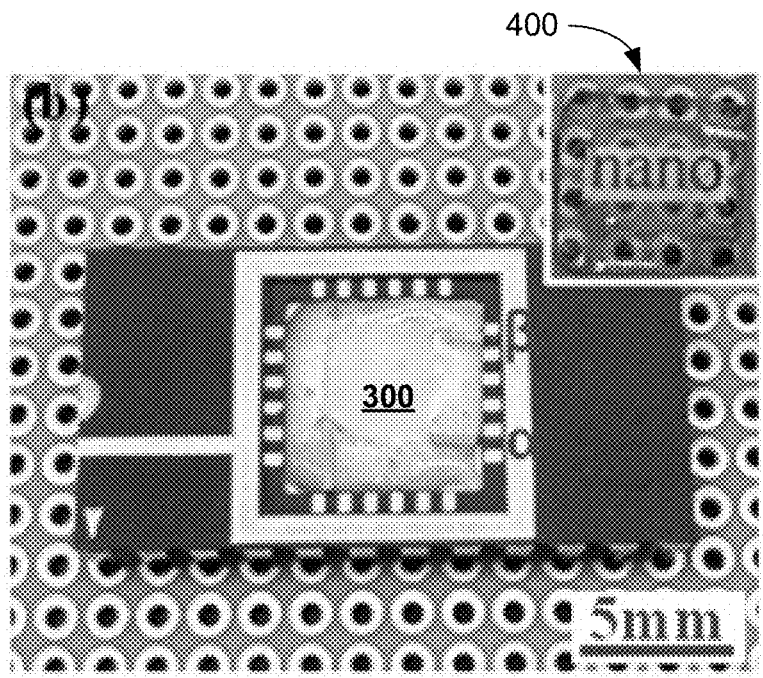
FIGS. 4A and 4B are images of a fabricated LSPD of FIG. 3A in accordance with various embodiments of the present disclosure.
Figure 4B:
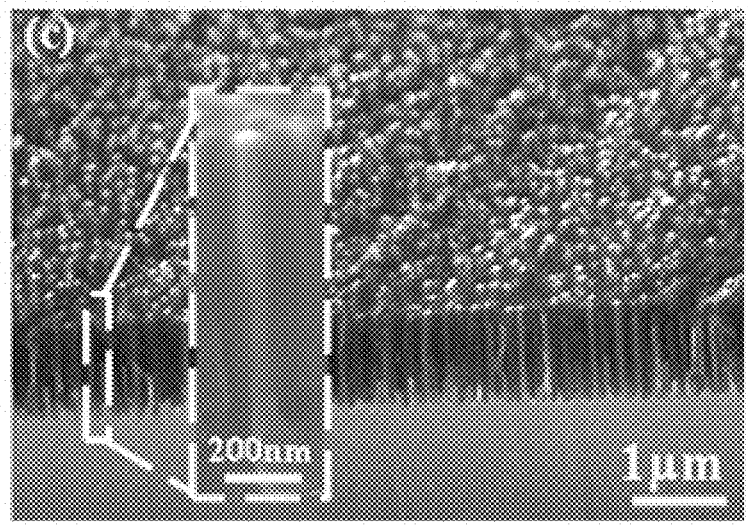
Figure 4C:
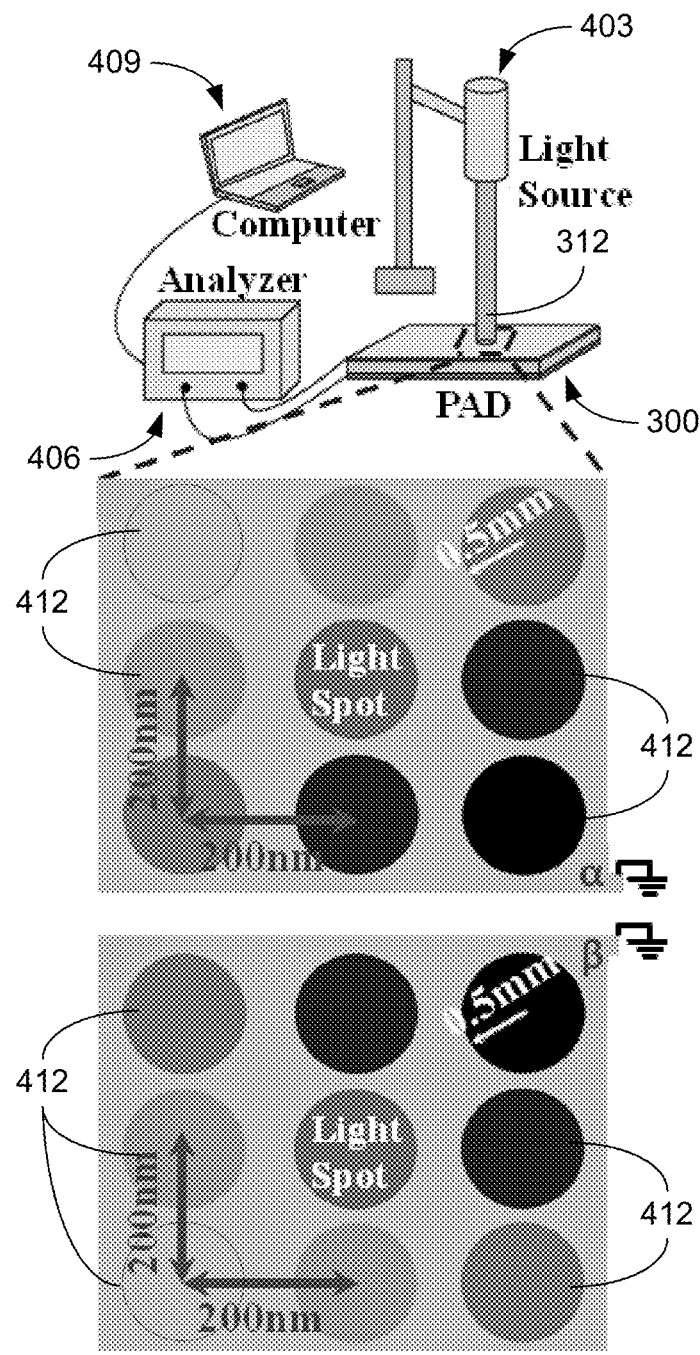
FIG. 4C is a graphical representation of a system used for multi-cycle testing of the fabricated LSPD of FIG. 4A in accordance with various embodiments of the present disclosure.

Multi-cycle tests were performed on a fabricated LSPD 300 with a sensing area size of 3×3 mm. FIG. 4A is a photograph of the fabricated LSPD 300 with connection points α and β indicated. The inset image 400 of FIG. 4A illustrates its transparent feature. FIG. 4B shows an SEM image of a cross-section of the LSPD 300, which includes two parallel common electrodes and the enclosed perpendicularly aligned ZnO nanorod arrays. The ZnO nanorods have a spacing of about 200 nm. The multi-cycle tests were performed by repeatedly moving a small light spot 312 (about 0.5 mm in radius) on the 3×3 mm LSPD 300 with a step of about 200 nm and measuring the currents responding to the light spot position. FIG. 4C shows a graphical representation of the system used for testing the LSPD 300. The system includes a light source 403 that projects a light spot 312 onto the LSPD 300. The light source 403 may be repositioned in predefined increments. An analyzer 406 provides resistance measurement circuits 315 (FIG. 3A) to determine the resistances seen at the connection points α and β. A computing device 409, such as a computer, may be used to convert the resistance measurements into the position of the light spot 312. FIG. 4C graphically illustrates how a light spot 312 can be moved to, e.g., 9 points in a 3×3 matrix over the sensing area of the LSPD 300. The gray scale of the measurement position 412 illustrate the relative difference in current (and thus resistance) seen by the resistance monitoring circuits 315 at the two connection points, α and β. During testing of the LSPD 300, a 0.5 mm light spot 312 was moved at increments of about 200 nm to obtain the resistance measurements.

Figure 4D:
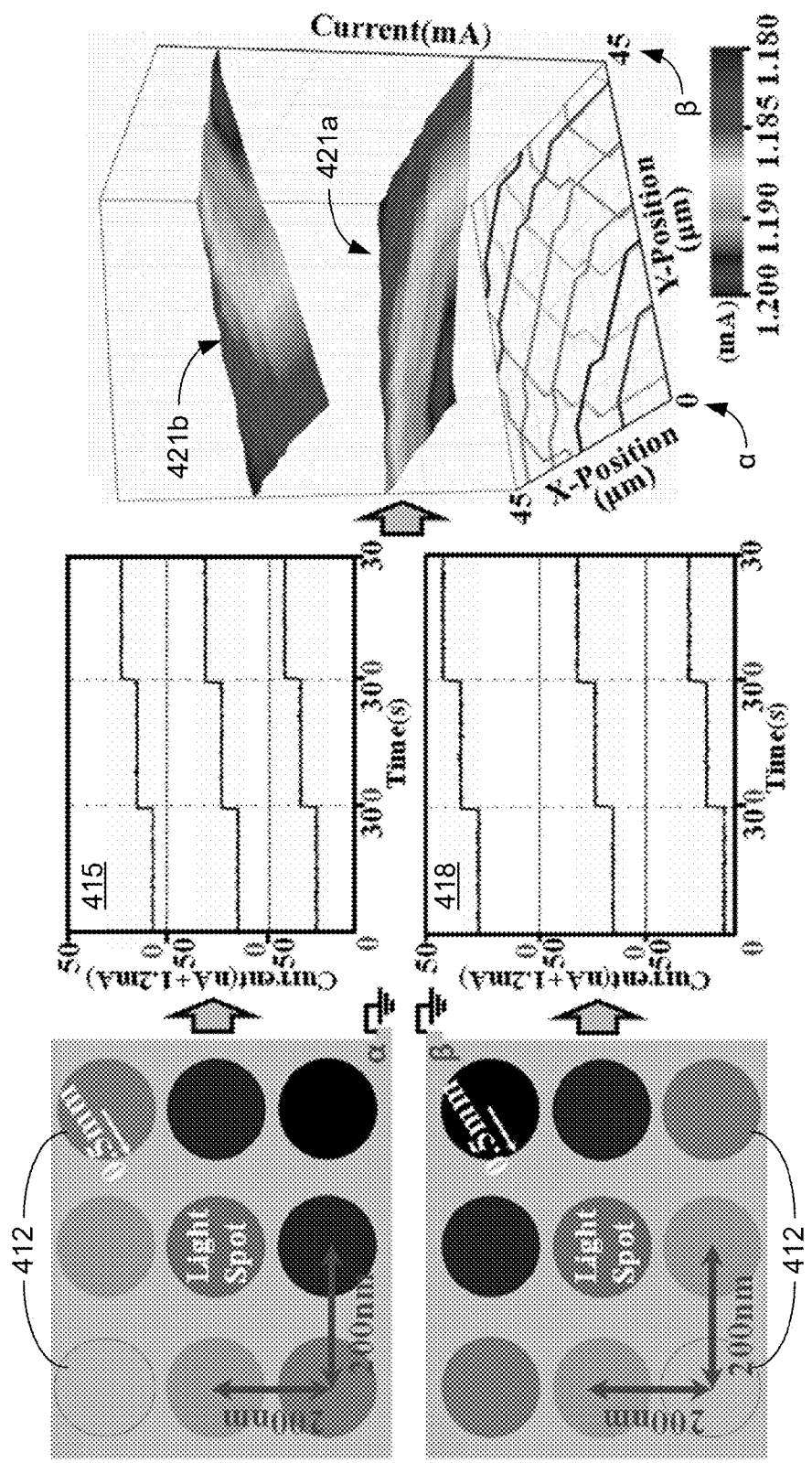
FIG. 4D includes plots illustrating characteristics of the fabricated LSPD of FIG. 4A in accordance with various embodiments of the present disclosure.

Referring now to FIG. 4D, as the light spot 312 is moved to different locations, the two current monitoring circuits 315 determine the currents at the two connection points. As shown in FIG. 4D, the distance between adjacent measurement positions 412 is about 200 nm. The gray scale of the measurement positions 412 illustrates the proportional relationship between the magnitudes of the currents when light illuminates the corresponding positions 412. By acquiring the currents through the two independent resistance monitoring circuits 315, a current matrix can be obtained, which includes the current measurements corresponding to the different positions of the light spot 312. The example of FIG. 4D illustrates a 3×3 current matrix where the current-time plots 415 and 418 show the measured current at α and β, respectively, for each corresponding measurement position 412. When the currents are measured in increments of 200 nm, the location of the light spot 312 can be identified with a resolution of 200 nm.

After the measurements have been completed, contour plots, lookup tables and/or mathematical relationships of the currents can be generated and used to determine the location of a light spot 312. An example of contour surface plots generated from measured currents is shown in FIG. 4D. In the illustrated example, the currents were measured with the light spot moving with a step size of 5 µm over a sensing area of 45×45 µm. The lower contour plot 421a represents the currents measured at connection point α and the upper contour plot 421b is the currents measured at connection point β. The solid and dashed lines in the x-y plane of FIG. 3D are equal-current contour lines corresponding to the contour surfaces 421a and 421b, respectively, and illustrate intersecting points of the equal-current contour lines. Because of the incremental movement of the light spot 312, the contour lines are not smooth.

ZnO nanorod arrays can be synthesized using a low temperature hydrothermal method, which enables better morphology control and flexible polymer substrate compatibility. The electrodes can be fabricated from, e.g., gold thin film (or other appropriate transparent conductive material) using, e.g., deposition methods. In some implementations, the ZnO nanorod arrays may be grown on the bottom electrode using a bottom-up method and then covered with the top electrode. A top-down method (or a combination of bottom-up and top-down methods) may also be employed for etching semiconducting photosensitive thin film to form the nanorod arrays, which could be also served as the raw building materials for the 3D PAD 112 (FIG. 1B). The characteristics of the nanorod arrays and electrodes enable the 3D PAD 112 to possess flexibility, lower manufacturing cost, and tailoring convenience for a multitude of light spot detection applications. LSPDs using 3D PADs have low-cost, low-noise, and high-resolution characteristics. More importantly, such LSPDs can be mass produced for direct and wide applications due to an easy bottom-up production process.

Figure 5A:
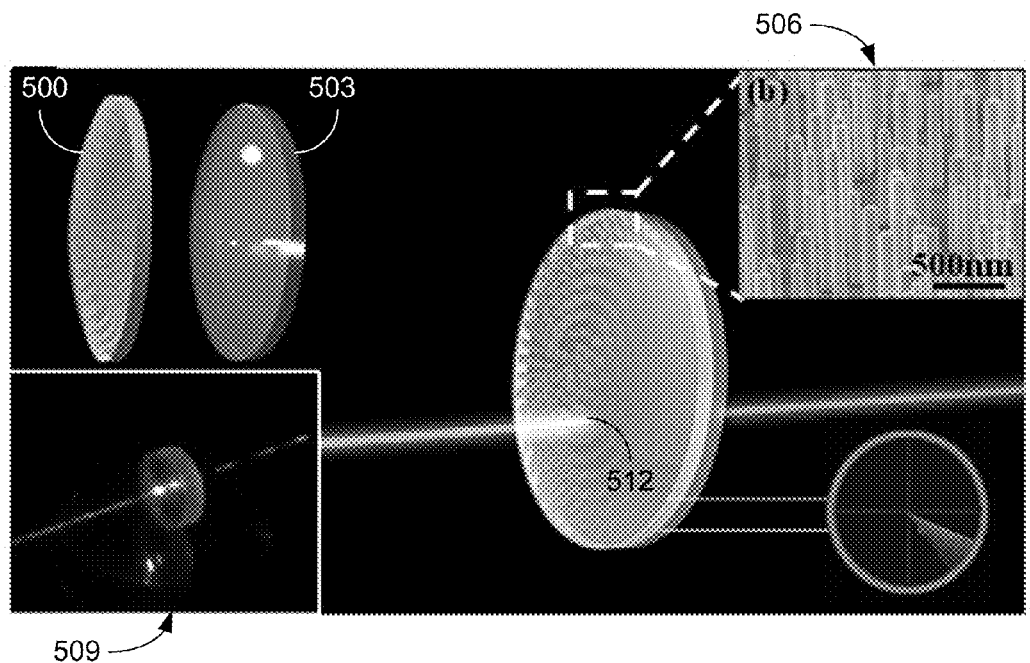
FIGS. 5A through 5C are images of a LSPD of FIG. 3A that can be used with a lens in accordance with various embodiments of the present disclosure.
Figure 5B:
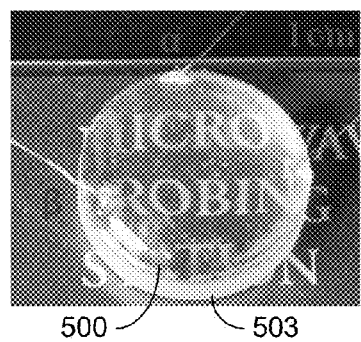
Figure 5C:
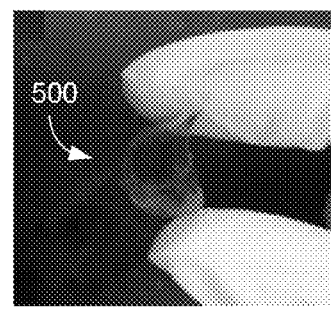

Referring to FIG. 5A, shown are illustrations of examples of the structure and operation of a flexible and sandwich-structured LAPD 500 attached to an optical lens 503. The light spot position through the lens 503 can be directly detected by the attached LSPD 500, which includes two parallel electrode layers with high-density ZnO nanorods that are grown in-between the electrodes using a hydrothermal method. The ZnO nanorods are substantially perpendicular to the electrodes as shown in the SEM image 506. The position at which the light spot 512 goes through the lens 503 can be determined from the current measured by two independent resistance monitoring circuits (not shown). The inset image 509 of FIG. 5A is an image of the as-fabricated LSPD 500 on a lens. The LSPD 500 was made of ZnO nanorod arrays grown over a large area (2 cm$^2$) on an arc-sharp Polydimethylsiloxane (PDMS). The LSPD 500 possesses high transmittance (as illustrated in FIG. 5B) and flexibility (as shown in FIG. 5C).

Figure 5D:
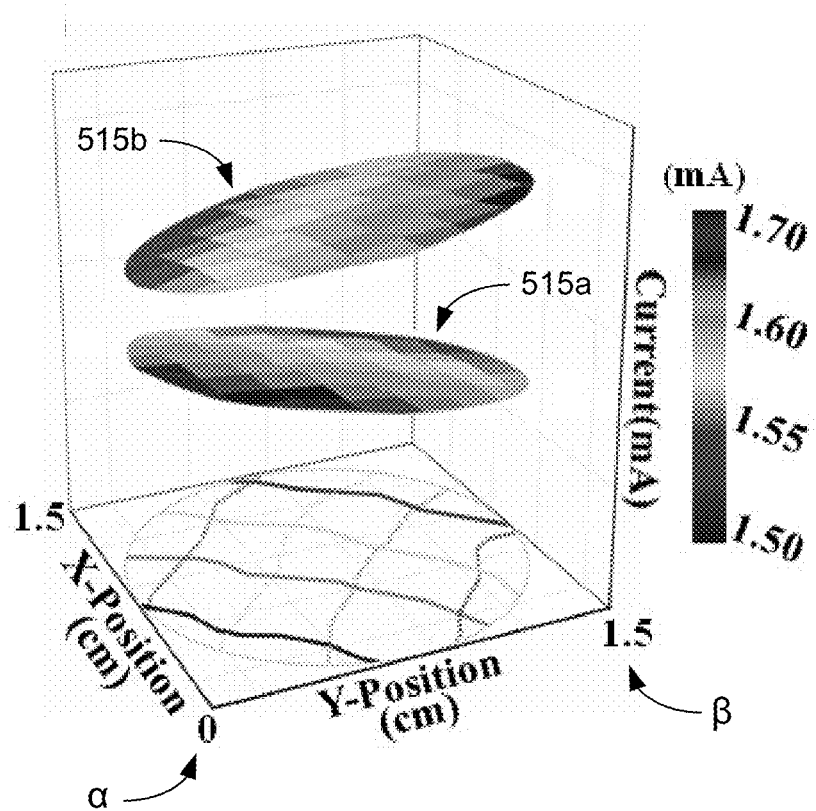
FIG. 5D is a plot illustrating characteristics of the LSPD of FIGS. 5A-5C in accordance with various embodiments of the present disclosure.

FIG. 5D illustrates contour surface plots of currents with a light spot 512 moving over the surface of the circular LSPD 500. The contour plots 515a and 515b are of currents from two independent monitoring circuits connected at different points along the edge of the sensing area, where the light spot moved on a 1.5 cm×1.5 cm surface area with an incremental step of about 0.15 cm during calibration. The voltage applied to the LSPD 500 was 10V and the light spot 512 had a radius of about 0.5 mm. The lower contour surface 515a corresponds to the current seen by the resistance monitoring circuit connected at α of FIG. 5B and the upper contour surface 515b corresponds to the current seen by the resistance monitoring circuit connected at β of FIG. 5B. The solid and dashed lines in the x-y plane of FIG. 5D are equal-current contour lines corresponding to the contour surfaces 515a and 515b, respectively, and illustrate intersecting points of the equal-current contour lines. In this way, resistance measurements obtained by the resistance measuring circuits can be used to determine the position of the light spot 512 in x and y coordinates.

In order to break the resolution limitation of prevailing 2D thin-film PSDs, a LSPD including a 3D PAD with 3D pixels has been developed using grown ZnO nanorod arrays. A fabricated LSPD has a measured resolution of 200 nm, which may be further reduced to resolutions of 10 nm or less. The 3D PAD of the LSPD includes arrays of, e.g., millions of nanorods, the size of which may be adjusted to provide improved resolutions. The volume of the photo sensitive material can be adjusted to avoid undetectable photoelectric characteristic due to thermal electron supersaturation. Furthermore, the 3D PAD made using a bottom-up method, which has significant advantages in fabrication, resolution, power consumption, etc. Furthermore, synthesizing ZnO nanorods on flexible substrates, enables the LSPD to be used in a wide variety of applications in flexible electronics. Direct application of the LSPD including a 3D PAD can have universal applications in industry, such as in precision machining and precise position control servo systems; in military applications such as, for example, target detecting and locating; and in daily life with, for instance, high dense media technology, etc.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. A light spot position sensitive detection system, comprising:
   a sensing area comprised of a surface of an array of substantially aligned photo sensitive nanorods extending between and coupled to a common electrode and a common semi-conductive film, the substantially aligned photo sensitive nanorods substantially perpendicular to the common electrode and the common semi-conductive film;
   a plurality of resistance monitoring circuits coupled to the common electrode and the common semi-conductive film; and
   a processing circuitry coupled to the plurality of resistance monitoring circuits, wherein the processing circuitry is configured to determine a position of a light spot on the sensing area based upon measurements obtained by the plurality of resistance monitoring circuits.

2. The light spot position sensitive detection system of claim 1, wherein the substantially aligned photo sensitive nanorods comprise zinc oxide (ZnO) nanorods.

3. The light spot position sensitive detection system of claim 2, wherein the ZnO nanorods have a radius of about 25 nm.

4. The light spot position sensitive detection system of claim 3, wherein the ZnO nanorods have a height of about 500 nm or greater.

5. The light spot position sensitive detection system of claim 2, wherein the ZnO nanorods have a radius of about 10 nm or less.

6. The light spot position sensitive detection system of claim 1, wherein spacing of the substantially aligned photo sensitive nanorods in the array is about 200 nm or less.

7. The light spot position sensitive detection system of claim 1, wherein the common electrode comprises a transparent conductive material and is configured to allow at least a portion of a light spot to pass through the common electrode and illuminate a corresponding portion of the array of substantially aligned photo sensitive nanorods.

8. The light spot position sensitive detection system of claim 1, wherein individual ones of the plurality of resistance monitoring circuits include a voltage supply and a current monitoring device.

9. The light spot position sensitive detection system of claim 1, wherein the plurality of resistance monitoring circuits comprises a first resistance monitoring circuit coupled to the common electrode and the common semi-conductive film at a first location, and a second resistance monitoring circuit coupled to the common electrode and the common semi-conductive film at a second, different location.

10. The light spot position sensitive detection system of claim 9, wherein the processing circuitry is configured to determine a first curve of distance from the first location based on the measurement obtained by the first resistance monitoring circuit and a second curve of distance from the second location based on the measurement obtained by the second resistance monitoring circuit, and wherein the processing circuitry is configured to obtain an intersecting point of the first and the second curves as the position of the light spot.

11. A light spot position detector, comprising:
a first integral layer including a transparent conductive material;
a second integral layer substantially in parallel to the first layer and including a semi-conductive material; and
an array of substantially aligned photo sensitive nanorods extending between and coupled to the first and second integral layers, the photo sensitive nanorods substantially perpendicular to the first and second layers;
a first resistance monitoring circuit coupled to the first integral layer and the second integral layer at a first location,
a second resistance monitoring circuit coupled to the first integral layer and the second integral layer at a second, different location; and
wherein the array of substantially aligned photo sensitive nanorods is configured to receive at least a portion of light of a light spot passing through the first layer and the first and second resistance monitoring circuits are configured to detect changes in resistance caused by exciting electrons in the substantially aligned photo sensitive nanorods illuminated by the light.

12. The light spot position detector of claim 11, wherein the substantially aligned photo sensitive nanorods comprise zinc oxide (ZnO) nanorods.

13. The light spot position detector of claim 12, wherein the ZnO nanorods have a radius of about 25 nm.

14. The light spot position detector of claim 13, wherein the ZnO nanorods have a height of about 500 nm or greater.

15. The light spot position detector of claim 12, wherein the ZnO nanorods have a radius of about 10 nm or less.

16. The light spot position detector of claim 12, wherein spacing of the substantially aligned photo sensitive nanorods in the array is about 200 nm or less.

17. The light spot position detector of claim 11, wherein the light spot position detector is configured to determine a position of the light spot by determining a first distance of the light spot from the first location based on the change in resistance obtained by the first resistance monitoring circuit and a second distance of the light spot from the second location based on the change in resistance obtained by the second resistance monitoring circuit.

18. The light spot position detector of claim 11, wherein each nanorod is configured to be a pixel.

19. A method, comprising:
illuminating a portion of a sensing area of a photo detector with a light spot, the photo detector including an array of substantially aligned photo sensitive nanorods extending between and coupled to a common electrode and a common semi-conductive film;
obtaining a first resistance measurement at a first location in the common semi-conductive film around the array of substantially aligned photo sensitive nanorods;
obtaining a second resistance measurement at a second, different location in the common semi-conductive film around the array of substantially aligned photo sensitive nanorods; and
determining a position of the light spot on the sensing area of the photo detector based upon the first and second resistance measurements.

20. The method of claim 19, wherein the position of the light spot is determined using a lookup table of calibration measurements.

21. The method of claim 19, wherein the position of the light spot is determined with a resolution of at least 200 nm.

22. The method of claim 19, wherein the step of determining the position of the light spot comprising:
determining a first curve of distance from the first location based upon the first resistance measurement;
determining a second curve of distance from the second location based upon the second resistance measurement; and
determining an intersecting point of the first and second curves as the position of the light spot.

23. The method of claim 20, wherein the lookup table comprises a resistance matrix including a plurality of reference resistance measurements corresponding to different predetermined positions, and wherein the step of determining the position of the light spot comprises determining the position of the light spot based upon the obtained resistance measurements with reference to the resistance matrix.

* * * * *